(12) United States Patent
Hellweg

(10) Patent No.: US 11,460,785 B2
(45) Date of Patent: Oct. 4, 2022

(54) METHOD FOR THE QUALIFICATION OF A MASK FOR MICROLITHOGRAPHY

(71) Applicant: Carl Zeiss SMT GmbH, Oberkochen (DE)

(72) Inventor: Dirk Hellweg, Langenau (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/880,132

(22) Filed: May 21, 2020

(65) Prior Publication Data

US 2020/0285158 A1 Sep. 10, 2020

Related U.S. Application Data

(63) Continuation of application No. PCT/EP2018/081554, filed on Nov. 16, 2018.

(30) Foreign Application Priority Data

Nov. 22, 2017 (DE) .......................... 102017220872.4

(51) Int. Cl.
*G03F 7/20* (2006.01)

(52) U.S. Cl.
CPC .......... *G03F 7/70666* (2013.01); *G03F 7/705* (2013.01); *G03F 7/70516* (2013.01); *G03F 7/70625* (2013.01)

(58) Field of Classification Search
CPC .. G03F 7/70666; G03F 7/705; G03F 7/70516; G03F 7/70625; G03F 1/70; G03F 1/84
See application file for complete search history.

(56) References Cited

U.S. PATENT DOCUMENTS

| | | |
|---|---|---|
| 2007/0032896 A1 | 2/2007 | Ye et al. |
| 2008/0221709 A1 | 9/2008 | Ishii et al. |
| 2008/0288912 A1 | 11/2008 | Kim et al. |
| 2010/0157046 A1 | 6/2010 | Kienzle et al. |
| 2010/0216263 A1 | 8/2010 | Daniels et al. |
| 2011/0188732 A1 | 8/2011 | Stroessner |
| 2012/0137260 A1 | 5/2012 | Pang |
| 2013/0063716 A1 | 3/2013 | Mann et al. |
| 2015/0001408 A1 | 1/2015 | Frank et al. |
| 2016/0012579 A1* | 1/2016 | Shi ........................ G01N 21/956 382/149 |
| 2017/0115576 A1 | 4/2017 | Bittner et al. |

(Continued)

FOREIGN PATENT DOCUMENTS

| | | | |
|---|---|---|---|
| DE | 102007033243 | 1/2009 | ............... G03F 7/20 |
| DE | 102009007770 | 8/2010 | ............... G03F 7/20 |

(Continued)

OTHER PUBLICATIONS

German Office Action for German Application No. DE 10 2017 220 872.4, dated Jul. 26, 2018 (with English Translation).

(Continued)

*Primary Examiner* — Mesfin T Asfaw
(74) *Attorney, Agent, or Firm* — Fish & Richardson P.C.

(57) ABSTRACT

For the qualification of a mask for microlithography, the effect of an aerial image of the mask on the wafer is ascertained by means of a simulation for predicting the wafer structures producible by means of the mask.

24 Claims, 4 Drawing Sheets

(56) References Cited

U.S. PATENT DOCUMENTS

| | | | |
|---|---|---|---|
| 2017/0228477 A1 | 8/2017 | Solowan | |
| 2017/0329231 A1 | 11/2017 | Finders | |

FOREIGN PATENT DOCUMENTS

| | | | | |
|---|---|---|---|---|
| DE | 102010029049 | 11/2011 | ............. | G02B 17/00 |
| DE | 102013212613 | 12/2014 | ............... | G03F 7/20 |
| DE | 102017101340 | 8/2017 | ............... | G03F 1/84 |
| JP | H 10-284368 | 10/1998 | ........... | H01L 21/027 |
| JP | 2005-099851 | 4/2005 | ............... | G03F 1/08 |
| JP | 2008-262215 | 10/2008 | ............... | G03F 1/08 |
| JP | 2008-310228 | 12/2008 | ............... | G03F 1/08 |
| JP | 2010-034402 | 2/2010 | ........... | H01L 21/027 |
| JP | 2010-276960 | 12/2010 | ............... | G03F 1/08 |
| JP | 2011-517127 | 5/2011 | ........... | H01L 21/027 |
| JP | 2012-014058 | 1/2012 | ............... | G03F 1/84 |
| JP | 2017-107179 | 6/2017 | ............... | G03F 7/20 |
| JP | 2017-538157 | 12/2017 | ............... | G03F 1/70 |
| KR | 1020090106656 | 10/2009 | ......... | H01L 21/3065 |
| KR | 1020170094082 | 8/2017 | ............... | G03F 7/20 |
| WO | WO 2006/001416 | 1/2006 | ........... | H01L 21/027 |
| WO | WO 2007/058240 | 5/2007 | ........... | H01L 21/027 |
| WO | WO 2014/047610 | 3/2014 | ............. | G06F 19/00 |

OTHER PUBLICATIONS

The Notification of Reasons for Rejection issued by the Japanese Patent Office for Japanese Application No. 2020-528220, dated May 20, 2021.

The Notice of Reasons for Rejection issued by the Korean Intellectual Property Office for Application No. KR 10-2020-7017285, dated Nov. 24, 2021 (with English Translation).

The First Office Action issued by the Chinese Patent Office for Application No. CN 201880075892.8, dated Mar. 8, 2022 (with English Translation).

\* cited by examiner

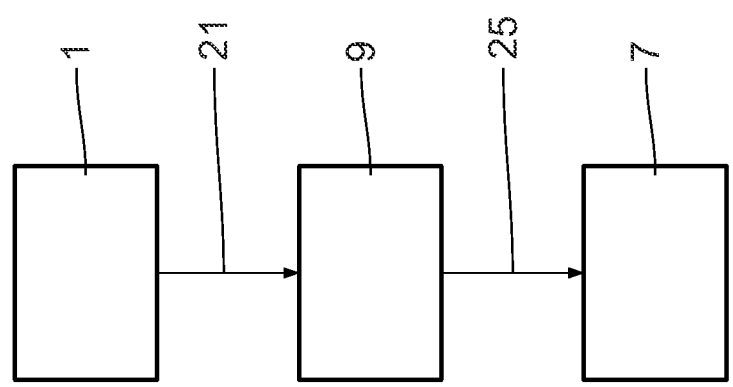

METHOD FOR THE QUALIFICATION OF A MASK FOR MICROLITHOGRAPHY

CROSS REFERENCE TO RELATED APPLICATIONS

This application is a continuation of and claims priority under 35 U.S.C. § 120 from PCT application No. PCT/EP2018/081554, filed on Nov. 16, 2018, which claims the priority of the German patent application DE 10 2017 220 872.4, filed on Nov. 22, 2017. The entire contents of each of these priority applications are incorporated herein by reference.

TECHNICAL FIELD

The invention relates to a method for the qualification of a mask for microlithography. The invention additionally relates to a system for the qualification of a mask for microlithography.

BACKGROUND

In microlithography, structures of photomasks are imaged onto a wafer. The structures producible on the wafer in this way depend firstly on the mask structures, and secondly on the imaging properties of the projection exposure apparatus.

For the qualification of a photomask it is crucial to be able to assess whether or not the mask structures are suitable for producing predetermined wafer structures. It is an object of the invention to improve a method and a system for the qualification of a mask for microlithography.

These objects are achieved by means of the features of the independent claims of the invention.

SUMMARY

The heart of the invention consists in combining, for the qualification of a mask for microlithography, a detection of at least one aerial image of the mask with a simulation for determining the effect of the aerial image on the wafer.

It has been recognized according to the invention that a qualification of the mask is thereby possible by way of the wafer structures producible with the aid of said mask. This results in a more reliable qualification of the mask.

A resist model and/or an etching model are/is used for determining the effect of at least one of the one or more aerial images on the wafer.

The resist model serves for predicting the structures in the photoresist of the wafer which result from the exposure thereof with the image of the mask.

The photoresist is a sacrificial layer. It is removed after an etching step in the wafer production process. It serves as an etching mask for structuring the structures of the wafer that are used electrically later. The etching process is simulated by means of an etching model.

For the qualification of the mask, the prediction of the wafer structures producible by means of said mask is compared with at least one predefined boundary condition which must be satisfied by the wafer structures to be produced.

The boundary conditions result for example from the electrical functionality of the component to be produced, in particular of the chip. By way of example, an edge placement error is permitted to have a magnitude at most such that it does not result in an electrical short circuit, or structure size errors are permitted to have a magnitude at most such that the requirements in respect of the electrical capacitance are satisfied.

With the aid of the method according to the invention it is possible to use the actually relevant variables, in particular the wafer structures, for the qualification of the mask. In particular, the direct effect of the mask on the wafer is qualified, rather than just individual error contributions, which generally are not independent of one another. In particular, a more reliable qualification of the mask is possible as a result.

According to the invention, it has been recognized, in particular, that no compensation effects can be used in the case of a separate measurement of different contributions to the edge placement error, for example. An integral qualification of the mask according to the present invention results in an improved characterization of the mask and, in particular, in a higher mask yield. With the aid of the method according to the invention, it is not necessary, in particular, separately to determine and/or to budget a plurality of contributions to the characterization of mask errors.

With the aid of the method according to the invention, it is possible, in particular, to increase the yield in mask production and/or wafer production or to reduce rejects.

In accordance with one aspect of the invention, a model for characterizing the lithography process serves for simulating the effect of the aerial image of the mask on the wafer. Said model can comprise a plurality of different submodels. It can comprise, in particular, the entire chain of action from mask design through mask production, the optical imaging of the mask, the exposure and patterning of a radiation-sensitive layer on the wafer, in particular of a so-called resist layer, and the etching of the wafer with the patterned resist layer in order to produce the processed wafer. The model can reproduce in particular individual or a plurality, in particular all, of the steps of this chain of action. In this case, the different substeps of the model can be calibrated independently of one another.

The model for characterizing the lithography process is also referred to as a computational lithography model.

According to the invention, provision is made, in particular, for transferring actually measured aerial images to a wafer computationally by means of a calibrated resist and etching model. The effect of the mask is ascertained in particular by way of a simulation for predicting the processed wafer. The combination of the aerial image that is already accessible in mask production with a calibrated resist and etching model for wafer processing allows the qualification of the mask as early as during production of the mask, i.e. prior to the use of the mask in the wafer exposure apparatus.

In accordance with a further aspect of the invention, a plurality of images of different mask structures are determined, in particular captured, for determining the at least one aerial image of the mask. In particular at least 10, in particular at least 20, in particular at least 30, in particular at least 50, in particular at least 100, in particular up to several thousand, mask structures are determined, in particular captured. The number of mask structures determined is usually less than 100 000, in particular less than 30 000, in particular less than 10 000.

The different mask structures can be structures which are arranged in different regions on the mask. They can also differ in their details, for example the line width, the line frequency, the number of lines or the orientation of the lines. They can differ in particular with regard to a parameter relevant to their imaging onto the wafer.

In accordance with a further aspect of the invention, a plurality of aerial images of the at least one mask structure are recorded in different focal planes. Preferably, in each case a plurality of aerial images of all of the mask structures to be determined are recorded in different focal planes. It is thereby possible to detect focus process fluctuations of the exposure apparatus, in particular to characterize the effect thereof.

In accordance with a further aspect of the invention, a plurality of aerial images are set off against registration data with regard to their positioning.

It has been recognized that the use of registration data can be particularly advantageous for the qualification of the individual masks. As a result, the accuracy, in particular, can be increased.

For calibrating the resist model, the structures in the photoresist of the wafer are measured using an electron microscope. The parameters describing the photoresist process can thereupon be optimized in such a way that the deviations of the measured structures, in particular of the structure widths, from the structures predicted by the model with the aerial images as input are minimized.

The etching model can be calibrated correspondingly after the structures on the processed wafer have been measured by an electron microscope.

As an alternative to a separate calibration of the resist model and of the etching model, a joint calibration can also be effected by means of the structures on the processed wafer that are measured by an electron microscope. The aerial image data of the mask structures once again serve as input for the model.

In accordance with a further aspect of the invention, the resist model and/or the etching model or the combined resist-etching model are/is calibrated with the aid of wafer structures measured on a wafer.

The wafer structures are measured in particular with the aid of an electron microscope, in particular a scanning electron microscope.

In accordance with a further aspect of the invention, the resist model and/or the etching model are/is part of a model for characterizing the lithography process, which model comprises at least two submodels which are calibrated separately from one another. In particular, a separate calibration of the processes up to aerial image generation and the processes taking place after the latter is provided.

The calibration is effected in particular using illumination and imaging conditions such as are actually provided in the projection exposure apparatus provided for the exposure of the wafer.

If the aerial image(s) of the mask is/are not predicted with the aid of the model, but rather captured directly, it/they can advantageously serve as input for the resist model and/or the etching model or the combined resist-etching model. It has been found that this results in a considerable improvement in the prediction of the wafer structures producible by means of the mask.

In accordance with a further aspect of the invention, an optical model is used for determining the aerial image of the mask.

A selection from data for characterizing the mask design, measurements of the mask structures by an electron microscope, parameters for characterizing the illuminating settings used for illuminating the mask and parameters for characterizing the optical design of the projection exposure apparatus used for imaging the mask onto the wafer serves as input for said optical model.

The optical model can also be calibrated with the aid of actually captured aerial image data and the design input.

Various test structures of varying geometry, size and pitch are typically used in the calibration of the optical model.

In particular, predefined illumination and/or imaging conditions which at least substantially correspond to those of a scanner that is actually to be used for imaging the mask are used for calibrating the optical model.

Preferably, in particular, the characteristic properties of the illumination setting provided for illuminating the mask and/or the properties of the projection exposure apparatus are taken into account in this case.

In accordance with a further aspect of the invention, registration data are used for calibrating the optical model. Said registration data can be ascertained by means of separate measurements on the mask.

In accordance with a further aspect of the invention, for calibrating the optical model, a prediction error is minimized using a merit function. In this case, by way of example, the sum of the square deviations of all structures can be used as the merit function.

The chain of action from the mask to the production of the aerial image can be simulated with the aid of the optical model.

In accordance with a further aspect of the invention, a selection from the following variables is predefined as boundary condition: maximum edge placement error, maximum allowed fluctuation of the line width or of the area of contact structures, asymmetries in line widths or edge placements, line roughnesses and process window size (i.e. in a sufficiently large range of dose and focus fluctuations, the requirements in respect of previous variables are satisfied).

In particular, requirements resulting from the electrical functionality of the component to be produced serve as boundary condition.

In accordance with a further aspect of the invention, uncertainties in the simulation and/or statistical fluctuations are taken into account in the qualification of the mask.

It is possible, in particular, for aerial images concerning the entire process window of wafer exposure, in particular concerning the entire focus and/or dose range, to be included in the qualification of the mask. It is possible, in particular, to take account of uncertainties in the resist model and/or in the etching model or in the combined resist-etching model in the qualification. It is possible, in particular, to take account of statistical effects, in particular fluctuations, in the qualification.

What can serve as a criterion for the qualification of the mask is, in particular, that at least a specific proportion of the probability distribution ascertained, in particular at least 90%, in particular at least 95%, in particular at least 99%, in particular at least 99.9%, of the masks satisfies the predefined boundary condition.

The mask can be qualified in particular depending on whether the mask structures, at least with a predefined minimum probability, for example of at least 90%, in particular at least 95%, in particular at least 99%, in particular at least 99.9%, result in wafer structures which satisfy the at least one predefined boundary condition. The expected fluctuations and also knowledge of the illuminating setting to be used and/or of the optical data of the projection exposure apparatus can be taken into account in this case.

A system for the qualification of a mask for microlithography preferably comprises a device for capturing an aerial image of a mask structure, a device for measuring wafer structures producible with the aid of the mask, and also a computing unit for adapting parameters of a model for predicting wafer structures from a measured aerial image.

The system thus enables a prediction of the wafer structures with the aid of a simulation model in which actually captured aerial images of a mask serve as input.

DESCRIPTION OF DRAWINGS

Further details and advantages of the invention will become apparent from the description of exemplary embodiments with reference to the figures. In the figures:

FIG. 4 shows a greatly simplified illustration of the process flow for the qualification of a mask for microlithography.

DETAILED DESCRIPTION

The details of a method for the qualification of a mask 1 for microlithography are described below with reference to the figures.

Figure 1:
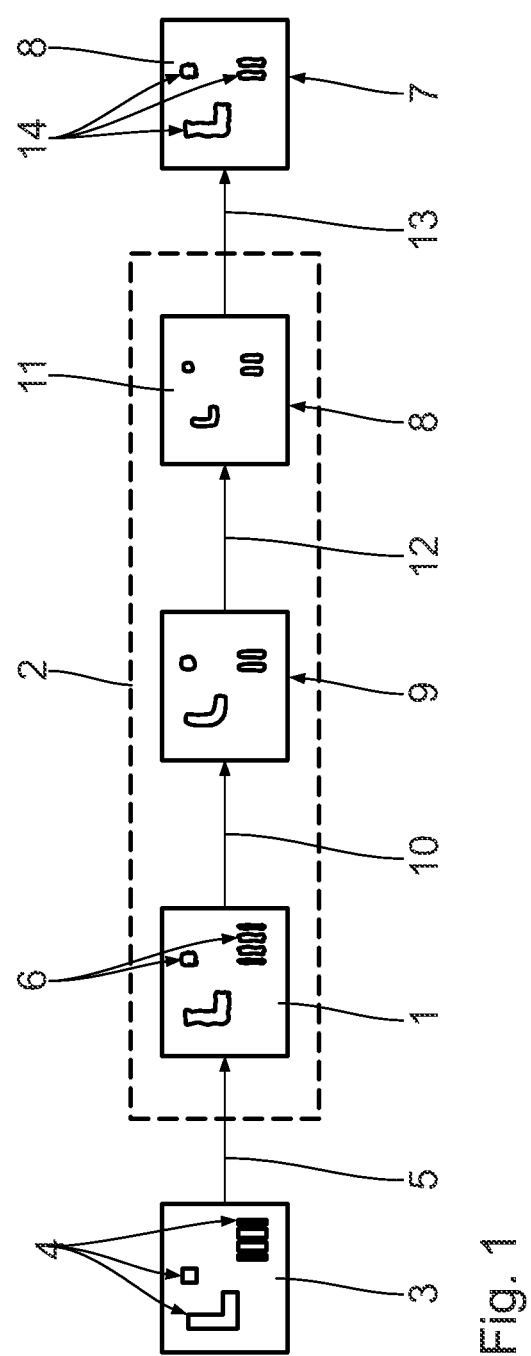
FIG. 1 schematically shows the different steps and relevant intermediate stages of a lithography process, FIG. 2 schematically shows a process sequence for the qualification of a mask for microlithography.

FIG. 1 shows the different steps and intermediate stages of a lithography process 2.

Firstly, the design 3 of a mask 1 is drafted. The design 3 comprises a plurality of structures 4 to be imaged.

In a mask production step 5, the mask 1 is produced. In particular, actual mask structures 6 are produced in this case. The mask structures 6 are intended to reproduce as exactly as possible the structures 4 to be imaged of the design 3 of the mask 1. They are imaged onto a wafer 8 during the production of a micro- or nanostructured component 7. The micro- or nanostructured component 7 forms in particular a chip, in particular a memory chip or processor (CPU or GPU). A lithography method is used for this purpose. Said lithography method is carried out with the aid of a projection exposure apparatus. An image of the mask structures 6 is generated in this case. Said image can be characterized by way of an aerial image 9 of the mask 1. The relationship between the mask 1, in particular the mask structures 6 thereof and its aerial image 9, is referred to as optical imaging 10.

The aerial image 9 of the mask 1 results in the exposure of a photosensitive layer 11 on the wafer 8. A photoresist, in particular, serves as photosensitive layer 11. The exposure of the photosensitive layer 11 on the wafer 8 is also referred to as the patterning of the photosensitive layer 11, or as a resist process 12 for short.

The patterning of the photosensitive layer 11 is followed by an etching process 13. During the etching process 13, the wafer 8 is etched. Wafer structures 14 to be produced are formed in this case.

The photosensitive layer 11 forming a sacrificial layer can subsequently be removed.

The mask production step 5, the optical imaging 10, the resist process 12 and the etching process 13 form parts of the lithography process 2.

The lithography process 2 and/or individual parts thereof can be described by one or more simulation models. It is possible, in particular, to depict the lithography process 2 as a whole by means of a computational lithography model.

For actual applications it is essential to qualify the masks 1 as to whether or not they are suitable for producing the component 7. This is referred to as qualification of the masks 1.

According to the invention, for the qualification of the mask 1, provision is made for determining the aerial image 9 of the mask 1 and also the effect of said aerial image on the wafer 8 with the photosensitive layer 11, in particular through to the production of the wafer structures 14 of the component 7. An integrative approach by way of the various process steps 10, 12 and 13 is provided for this purpose. In line with so-called holistic lithography, the qualification of the mask 1 described in even greater detail below is also referred to as holistic mask qualification.

It has been recognized according to the invention that, rather than the mask per se, its image, in particular its aerial image, or the effect thereof on the photosensitive layer on a wafer and the wafer structures resulting therefrom are the variables that are actually relevant for the qualification of a mask. The combination of aerial image capture and simulation of the wafer structures resulting from a given aerial image with the aid of a computational lithography model results in a significant improvement in the qualification of masks for microlithography.

The effect of the mask 1 in the lithography process 2 results from its aerial image 9. The capture and measurement of the aerial image 9 of the mask 1 result in a significantly more accurate input for a model for simulating the subsequent resist process 12 and/or the etching process 13 than the measurement of the mask structures 6 themselves.

In accordance with one alternative, the aerial image 9 can also be determined, in particular simulated, from the measurement of characteristic variables of the mask structures 6 with the aid of a model of the optical imaging 10. An aerial image generating simulator can be provided for this purpose. The latter can be part of a computational lithography platform.

Figure 2:
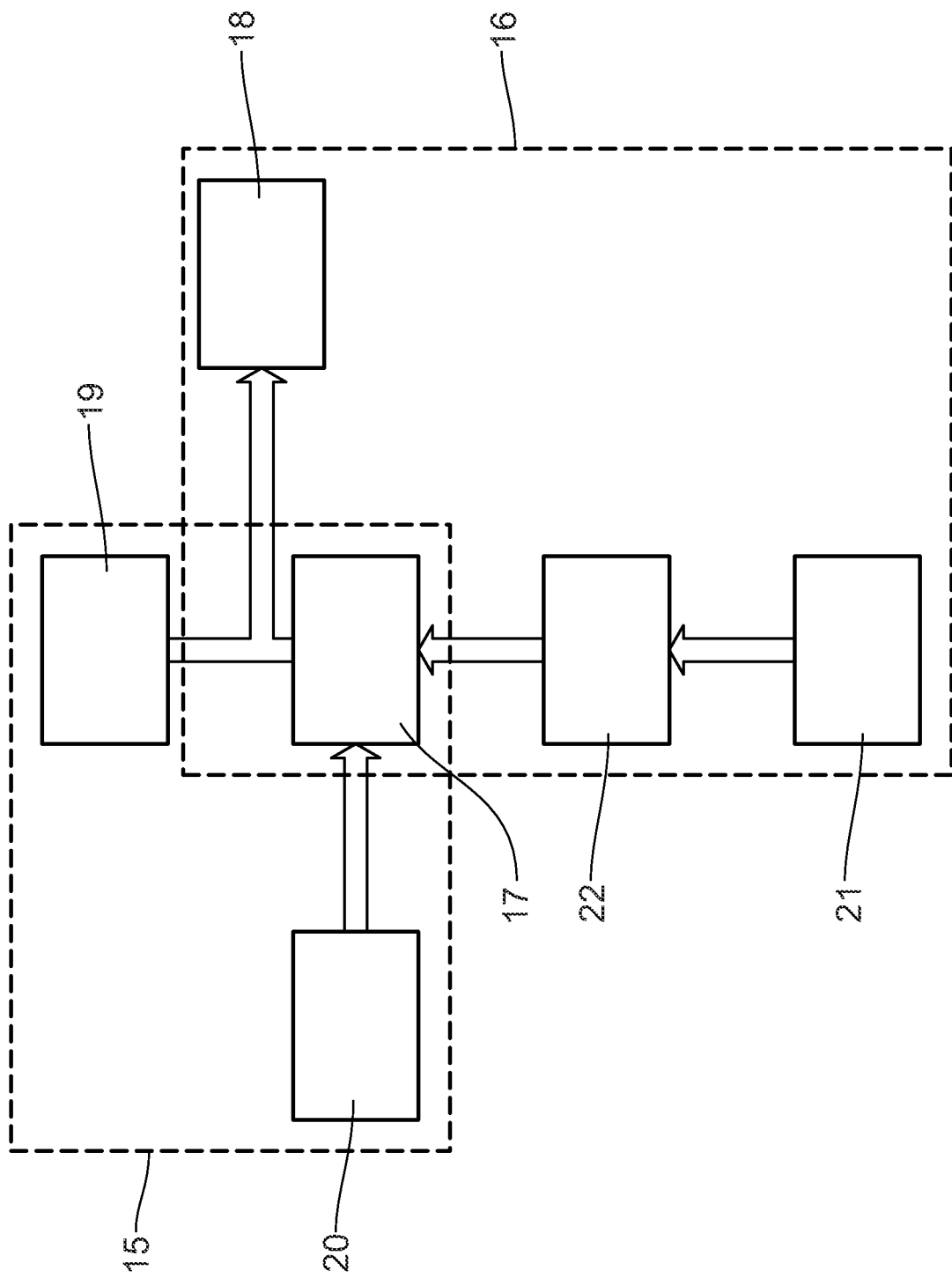

FIG. 2 schematically illustrates one example of the process flow during the qualification of the mask 1. The process development 15 and the mask qualification 16 are demarcated by way of example in FIG. 2. A calibrated computational lithography model 17 is at the center of the process flow. Said model can comprise submodels for the above-described method steps during the production of the component 7. One or more predefined boundary conditions 19 is/are taken into account for ascertaining the result 18 of the qualification of the mask 1. In particular, a maximum allowed edge placement error and/or maximum allowed variation of the line width can serve as boundary condition 19.

Moreover, the measurement 20 of wafer structures 14 serves as input for the lithography model 17. This can be done in particular with the aid of an electron microscope method.

Moreover, data for characterizing the aerial image 9 of the mask 1, in particular of the mask structures 6, serve as input for the lithography model 17 for the qualification of the mask 1. An aerial image measurement 21, in particular, is carried out for this purpose.

The aerial image measurement 21 of the mask structures 6 can be combined with a registration measurement of same. These data can be forwarded to a server 22. The server 22 can forward these data to the lithography model 17.

As an alternative thereto, the data of the aerial image measurement 21 and optionally of the registration measurement of the mask structures 6 can also be forwarded directly to the lithography model 17, i.e. serve as input for the lithography model 17.

Figure 3:
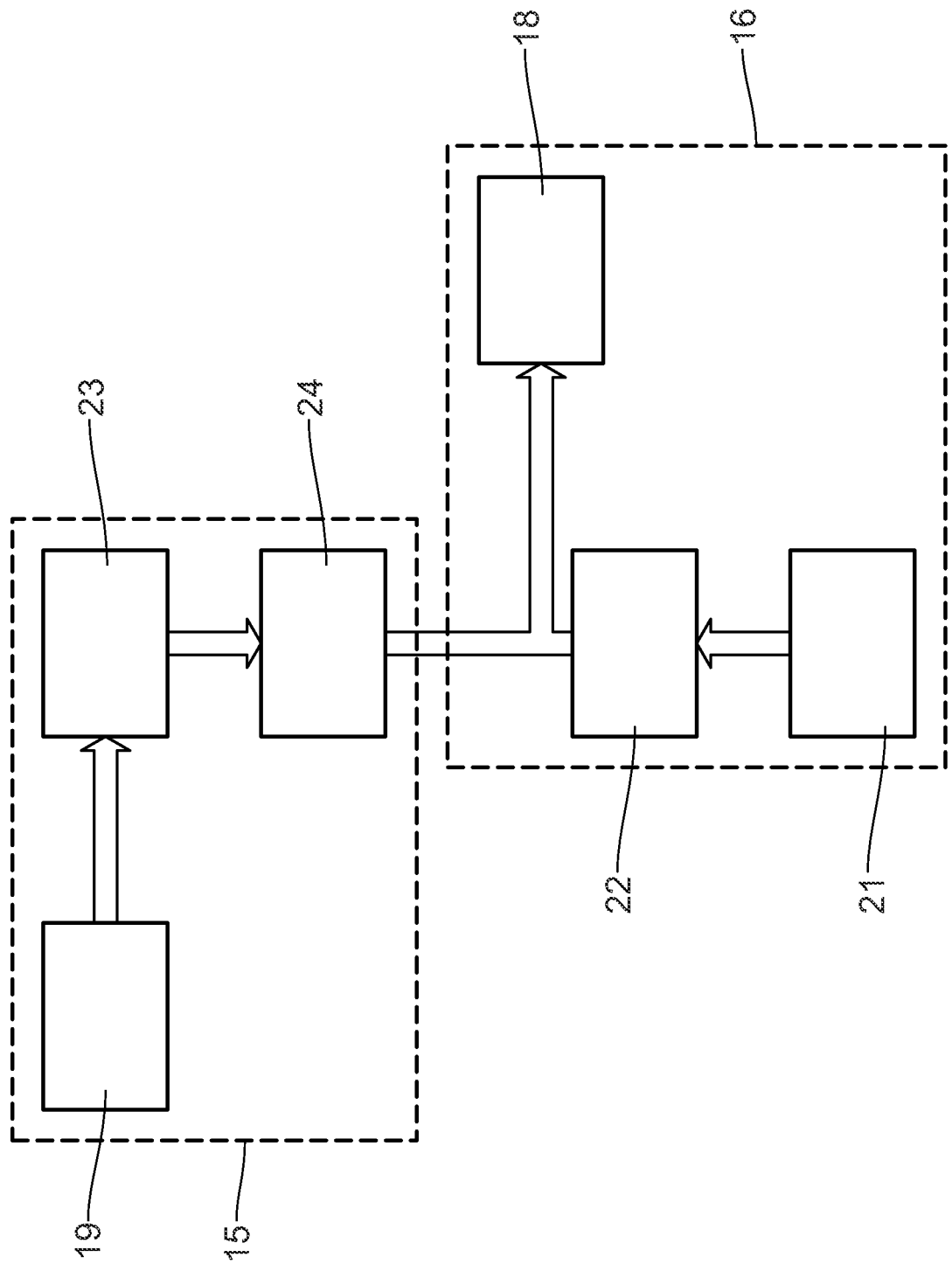
FIG. 3 shows a schematic illustration of an alternative method for the qualification of a mask for microlithography.

An alternative to the qualification process flow in accordance with FIG. 2 is illustrated by way of example in FIG. 3. In accordance with this alternative, a requirement profile 24 for the aerial image 9 of the mask 1, in particular of the mask structures 6, is ascertained from the boundary conditions 19 by way of a computer-aided simulation 23. For the qualification of the mask 1, a check is then made to establish whether the result of the aerial image measurement 21, if appropriate after computation with a registration measurement, satisfies the requirement profile 24.

The method is suitable, in principle, for arbitrary masks 1 for microlithography. The advantages of the method are particularly pronounced with regard to masks 1 for EUV wavelengths, which are also referred to as EUV masks.

The process flow is schematically illustrated once again in a greatly simplified manner in FIG. 4. For the qualification of the mask 1, an aerial image 9 thereof is determined. For determining the aerial image 9 of the mask 1, said aerial image is preferably captured directly. The effect of the aerial image 9 on the wafer 8 with the photosensitive layer 11 for producing the component 7 is ascertained, in particular predicted, with the aid of a simulation method 25. The simulation method 25 comprises a model for describing the resist process 12 and/or the etching process 13 or a combined resist-etching process. These models can be calibrated with the aid of measurements of the wafer structures 14, as is described in even greater detail below.

Further details of the method are described below. These details can be combined with one another in substantially any desired way. They should not be understood as restrictive for the method.

Actually measured aerial images 9 can be used for calibrating a computer-aided model for simulating the optical imaging 10. Preferably, such aerial images 9 are measured under illumination and/or imaging conditions identical or very similar to those in a lithography system provided for the later wafer exposure. In particular, the same wavelength, numerical aperture of the imaging, illumination setting and chief ray angle are preferably used.

The optical model for describing the optical imaging 10 can be calibrated in particular with concrete aerial image data and design parameters for describing a radiation source, an illumination setting and a projection exposure apparatus. Various test structures of varying geometry, size and pitch can be used for calibrating the optical model for describing the optical imaging 10. The parameters of the optical model are adapted in particular in such a way as to minimize the prediction error using a merit function. In this case, by way of example, the sum of the square deviations of all of the structures can be used as the merit function.

For the simulation 25 for predicting the effect of the aerial image 9 on the photosensitive layer 11 and, in particular, for the production of the wafer structures 14, it is possible to use, in particular, electron microscope images of the structures in the photosensitive layer 11 after the exposure thereof and, respectively, electron microscope images of the wafer structures 14. The structures in the photosensitive layer 11 on the wafer 8 can be measured by an electron microscope, in particular with regard to their size ("critical dimension", CD). The parameters describing the resist process 12 can then be optimized in such a way that the deviations of the measured structures from those predicted with the aid of the model with the measured aerial images 9 as input are minimized. The resist model is calibrated as a result.

Correspondingly, the wafer structures 14 can be measured by an electron microscope. By optimizing the parameters of an etching model for simulating the etching process 13 in such a way that the structure sizes of the wafer structures 14 on the processed wafer 8 result from the structure sizes in the photosensitive layer 11 as well as possible, the etching model is calibrated.

Instead of a separate calibration of the resist model and the etching model, it is possible to carry out a joint calibration of a resist-etching model with the aid of wafer structures 14 measured by an electron microscope. The aerial image data once again serve as input.

By using the actually measured aerial images 9 of the mask 1 as input for the resist and etching model, the prediction of the wafer structures 14 producible with the aid of the mask 1 can be significantly improved.

A plurality of aerial images 9, in particular of a plurality of different mask structures 6, can be recorded for the qualification of the mask 1. In particular, provision is made for recording at least 10, in particular at least 20, in particular at least 30, in particular at least 50, in particular at least 100, aerial images 9 of different mask structures 6. Even a few thousand aerial images 9 of different mask structures 6 can be recorded. Preferably and customarily in mask qualification, the qualification of the mask takes place by measuring a suitable selection of defined structures, the number of which can correspond to the aerial images. Alternatively, it is also possible to record an image of the entire mask, e.g. by combining many individual images or by means of reading an image sensor in a manner synchronized with a mask movement ("scan") (e.g. "TDI" Time Delay Integration).

The aerial images 9 are recorded, in particular measured, in particular using illumination and imaging conditions such as are provided in the projection exposure apparatus provided for imaging the mask 1 onto the wafer 8. In particular, a so-called aerial image metrology system (AIMS) can be used for measuring the aerial image. For details, reference should be made to DE 10 2010 029 049 A1 and DE 10 2013 212 613 A1.

Actually capturing the aerial image 9 of the mask 1 results in a considerable improvement, in particular in the reliability of the prediction, for the wafer structures 14 producible with the aid of the mask 1. In principle, the aerial image 9 can also be ascertained from a measurement of the mask structures 6 that is carried out by an electron microscope with the aid of the above-described optical model for simulating the optical imaging 10.

Actually capturing the aerial image 9, however, captures all effects relevant to the effect of the mask 1, in particular for example also the surface roughness of the mask, the so-called mask error enhancement factor (MEEF), the three-dimensional structure of the edges and also the optically relevant parameters of the materials of the mask 1.

Corresponding parameters can be taken into account in a model for simulating the optical imaging 10. As a result, however, the uncertainty with regard to the predicted values increases, since the simulation generally uses approximations and these parameters are known only with limited accuracy. By actually capturing the aerial images 9, it is possible to illuminate such uncertainties. This results in an increased yield in the mask production process.

Moreover, it is possible to measure process windows of the wafer exposure. For this purpose, it is possible to effect measurement in the focus range relevant to the wafer exposure. Additionally or alternatively, it is possible to measure the effect of dose fluctuations in the exposure of the mask 1.

For the qualification of the mask 1, the predicted wafer structures 14 producible with the aid of the aerial images 9 are compared with the requirements made of said wafer structures. The requirements made of the wafer structures 14 result from the electrical functionality of the component 7 to be produced. By way of example, the edge placement error must not be of a magnitude such that electrical short circuits can occur. If this can be precluded, the mask 1 is deemed to be positively qualified.

Uncertainties of the simulation process, in particular uncertainties in the description of the resist process 12 and/or of the etching process 13, and also statistical effects can be included computationally in the qualification of the mask 1. What can serve as a criterion for the positive qualification of a mask 1 is, in particular, that a specific proportion of a correspondingly ascertained probability distribution satisfies the predefined requirements. For details, reference should be made to the description above.

What is claimed is:

1. A method for the qualification of a mask for microlithography comprising the following steps:
   providing a mask having mask structures to be imaged onto a wafer,
   predefining at least one boundary condition which must be satisfied by wafer structures to be produced on a wafer,
   obtaining registration data by registration measurement of the mask structures on the mask,
   measuring a plurality of aerial images of the mask,
   determining an effect of at least one of the aerial images on the wafer by use of a simulation for predicting the wafer structures producible by use of the mask, and
   setting off a plurality of measured aerial images against the registration data to increase accuracy of positioning of the aerial images in predicting the wafer structures producible by use of the mask,
   wherein a resist model and/or an etching model are/is used for determining the effect of at least one of the aerial images on the wafer.

2. The method of claim 1, wherein a plurality of images of different mask structures are recorded for determining the at least one aerial image of the mask.

3. The method of claim 2, wherein a plurality of aerial images of at least one mask structure are recorded in different focal planes.

4. The method of claim 2, wherein the resist model and/or the etching model are/is calibrated with the aid of wafer structures measured on a wafer.

5. The method of claim 2, wherein for calibrating the resist model and/or the etching model, structures on the wafer are measured using an electron microscope.

6. The method of claim 2, wherein the resist model and/or the etching model are/is part of a model for characterizing the lithography process, which model comprises at least two submodels which are calibrated separately from one another.

7. The method of claim 2, wherein an optical model is used for determining the at least one aerial image of the mask.

8. The method of claim 1, wherein a plurality of aerial images of at least one mask structure are recorded in different focal planes.

9. The method of claim 1, wherein the resist model and/or the etching model are/is calibrated with the aid of wafer structures measured on a wafer.

10. The method of claim 1, wherein for calibrating the resist model and/or the etching model, structures on the wafer are measured using an electron microscope.

11. The method of claim 1, wherein the resist model and/or the etching model are/is part of a model for characterizing the lithography process, which model comprises at least two submodels which are calibrated separately from one another.

12. The method of claim 11, wherein calibrating the model comprise a calibration of first submodel for processes up to an aerial image generation and a calibration of the second submodel for the processes taking place after the aerial image generation.

13. The method of claim 1, wherein an optical model is used for determining the at least one aerial image of the mask.

14. The method of claim 13, wherein the optical model is calibrated with the aid of aerial image data.

15. The method of claim 14, wherein predefined illumination and/or imaging conditions which at least substantially correspond to those of a scanner that is actually to be used for imaging the mask are used for calibrating the optical model.

16. The method of claim 13, wherein predefined illumination and/or imaging conditions which at least substantially correspond to those of a scanner that is actually to be used for imaging the mask are used for calibrating the optical model.

17. The method of claim 13, wherein registration data are used for calibrating the optical model.

18. The method of claim 13, wherein for calibrating the optical model, a prediction error is minimized using a merit function.

19. The method of claim 13, wherein a selection from the following variables is predefined as boundary condition: maximum allowed edge placement error, maximum allowed fluctuation or deviation of the line width, maximum fluctuation or deviation of the area of a structure, maximum allowed asymmetries of the line width, maximum allowed line roughness.

20. The method of claim 13, wherein uncertainties in the simulation and/or statistical fluctuations are taken into account in the qualification of the mask.

21. The method of claim 1, wherein the plurality of aerial images and registration measurement of the mask structures are used as part of input to the simulation for predicting the wafer structures producible by use of the mask.

22. A system for the qualification of a mask for microlithography comprising
   a device for capturing a plurality of aerial images of a mask structure of a mask for microlithography,
   a device for measuring wafer structures producible with the aid of the mask,
   a device configured to obtain registration data by registration measurement of the mask structure of the mask, and
   a computing unit for predicting wafer structures from a measured aerial image,
   wherein the computing unit is configured to set off a plurality of captured aerial images against the registration data to increase accuracy of positioning of the aerial images in predicting the wafer structures from the measured aerial image.

23. A method for the qualification of a mask for microlithography comprising the following steps:
   providing a mask having mask structures to be imaged onto a wafer,
   predefining at least one boundary condition which must be satisfied by wafer structures to be produced on a wafer, obtaining registration data by registration measurement of the mask structures on the mask, measuring a plurality of aerial images of the mask, determining an effect of at least one of the aerial images on the wafer by use of a simulation for predicting the wafer structures producible by use of the mask, and setting off a plurality of measured aerial images against the registration data to increase accuracy of positioning of the aerial images in predicting the wafer structures producible by use of the mask, wherein a resist model and/or an etching model are/is used for determining the effect of at least one of the aerial images on the wafer, and wherein uncertainties in the simulation and/or statistical fluctuations are taken into account in the qualification of the mask.

24. The method of claim 23, wherein uncertainties in the resist model and/or in the etching model or in the combined resist-etching-model are taken into account in the qualification of the mask.

* * * * *